United States Patent
Ootani et al.

(10) Patent No.: US 6,823,229 B2
(45) Date of Patent: Nov. 23, 2004

(54) SUBSTRATE CARRIER MANAGEMENT SYSTEM AND PROGRAM

(75) Inventors: Masaki Ootani, Tokyo (JP); Yasuhiro Sato, Tokyo (JP); Takamasa Inobe, Tokyo (JP); Yasuhiro Marume, Hyogo (JP); Toshiyuki Watanabe, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 202 days.

(21) Appl. No.: 10/131,252

(22) Filed: Apr. 25, 2002

(65) Prior Publication Data

US 2003/0045959 A1 Mar. 6, 2003

(30) Foreign Application Priority Data

Aug. 28, 2001 (JP) ........................................ 2001-257665

(51) Int. Cl.$^7$ ............................................... G06F 19/00
(52) U.S. Cl. ........................ 700/112; 700/113; 700/121; 211/41.18; 118/500
(58) Field of Search .............................. 700/90, 95, 112, 700/113, 117, 121, 228; 211/41.18; 438/5; 118/500

(56) References Cited

U.S. PATENT DOCUMENTS 6,340,326 B1 * 1/2002 Kistler et al. ................ 451/286

FOREIGN PATENT DOCUMENTS

| JP | 6-260545 | 9/1994 |
|---|---|---|
| JP | 8-78301 | 3/1996 |
| JP | 9-22306 | 1/1997 |

* cited by examiner

Primary Examiner—Jayprakash N. Gandhi
(74) Attorney, Agent, or Firm—McDermott Will & Emery LLP

(57) ABSTRACT

The substrate carrier management system includes a pre-diffusion processing apparatus, a carrier cleaner, and a carrier conveyer. The pre-diffusion processing apparatus unloads a substrate from a supplied carrier in which the substrate is stored, performs predetermined processing on the substrate, and transfers the processed substrate stored in a carrier to be used after processing. The carrier cleaner cleans a carrier emptied as a result of taking a substrate out of the carrier. The carrier conveyer conveys a carrier between the pre-diffusion processing apparatus and the carrier cleaner. The empty carrier unloaded from the pre-diffusion processing apparatus is cleaned by the carrier cleaner, and the processed substrate is stored in the empty carrier. With this arrangement, it is possible to automatically change carriers and thereby continuously use a cleaned carrier in the subsequent step without using a dedicated carrier.

8 Claims, 7 Drawing Sheets

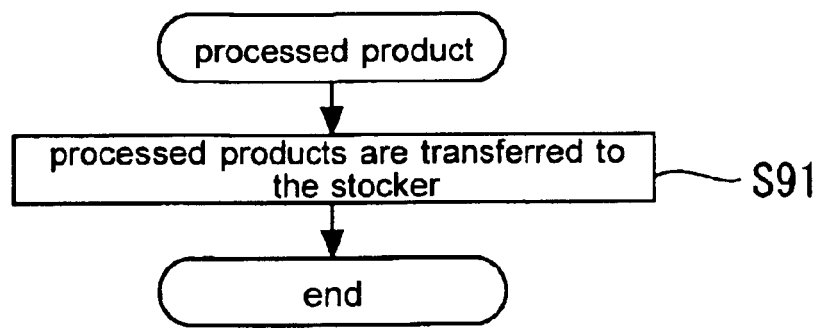
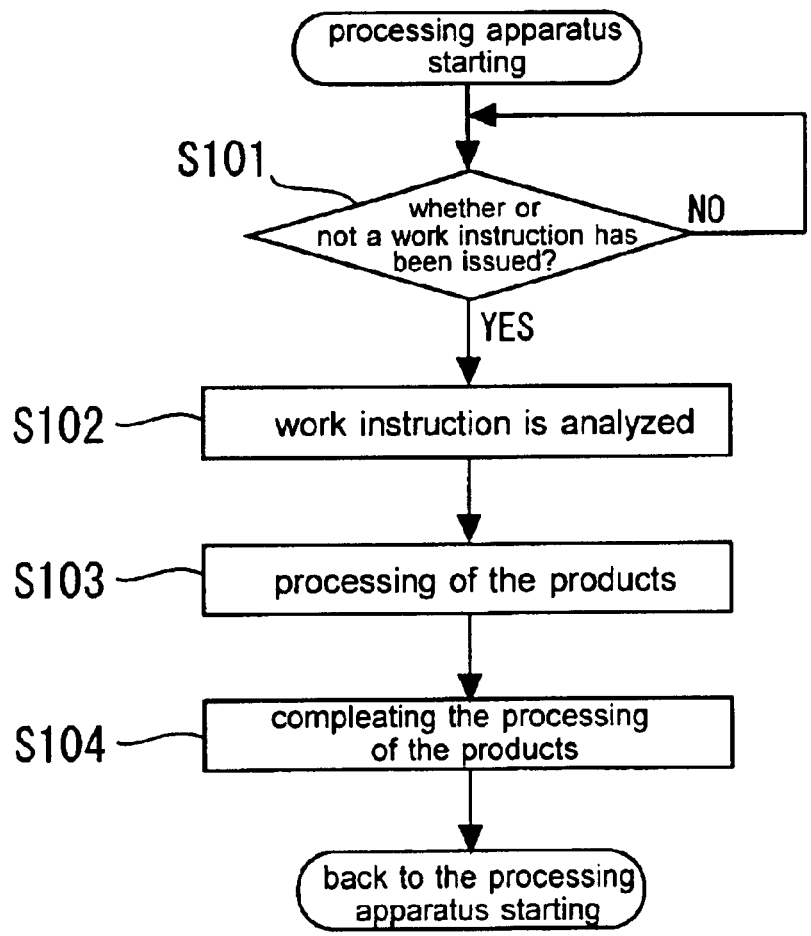

SUBSTRATE CARRIER MANAGEMENT SYSTEM AND PROGRAM

BACKGROUND OF THE INVENTION

1. Field of the Invention

The present invention relates to a substrate carrier management system and a program. In particular, the present invention is suitably applied to a management system for a carrier that stores semiconductor wafers.

2. Background Art

Generally, in semiconductor device fabrication lines, a plurality of wafers is placed in a carrier (container) before they are carried and processed by the carrier. The semiconductor device fabrication step includes such steps as pre-diffusion processing (cleaning), diffusion processing, photolithographic processing, chemical processing, ion implantation, and metalization. Each step is repeated until the completion of the product.

In such processing in each step, contamination of carriers by wafers poses a problem. For example, since the photolithographic process uses a photoresist, the carriers are contaminated by the wafers. In a step in which such contamination raises a problem, a measure has been taken such as replacement of one carrier with another beforehand.

The conventional method for replacing one carrier with another, however, has a problem that the carrier transfer and replacement work are complicated. A representative diffusion step will be described with reference to FIG. 11. In the figure, reference numeral 110 denotes a pre-diffusion processing apparatus; 120 a carrier to be supplied; 130 a removed empty carrier; 140 an empty carrier to be used after processing; 150 a processed product; 160 a carrier cleaner; 170 a diffusion processing apparatus; and 180 a carrier replacing apparatus.

As preprocessing, the diffusion step includes a wafer cleaning step generally called "pre-diffusion processing". The pre-diffusion processing is performed by the pre-diffusion processing apparatus 110 in FIG. 11. Generally, before and after this step, a carrier used in this process is replaced with another carrier of different type after the process.

That is, the carrier 120 to be supplied containing products is loaded into the pre-diffusion processing apparatus 110 for pre-diffusion processing. At that time, a general-type carrier is used as the carrier 120 to be supplied. When the carrier 120 to be supplied is given, the wafers on the carrier are taken into the pre-diffusion processing apparatus 110, and a request for unloading the emptied carrier is issued. Here, the empty carrier 130 to be removed is manually unloaded. The removed empty carrier 130 is supplied to the carrier cleaner 160 for cleaning.

After completion of the pre-diffusion processing, the pre-diffusion processing apparatus 110 requests the empty carrier 140 (to be used after processing) to retain the processed products. In response, the empty carrier 140 to be used after processing (dedicated for diffusion) is manually supplied.

The processed wafers are returned to the supplied empty carrier 140 to be used after processing which is then manually taken out, completing the pre-diffusion processing step.

The wafers subjected to the pre-diffusion processing are supplied to the diffusion processing apparatus 170 for diffusion processing. After the diffusion step, the products are supplied to the carrier replacing apparatus 180 that replaces the carrier dedicated for diffusion with a general-type carrier.

Thus, in the conventional method, the removed empty carrier 130 unloaded from the pre-diffusion processing apparatus 110 must be cleaned by the carrier cleaner 160 and conveyed to the carrier replacing apparatus 180. Furthermore, it is necessary to convey the replaced carrier dedicated for diffusion to the carrier cleaner 160 for cleaning. This means that carriers are transferred among the pre-diffusion processing apparatus 110, the diffusion processing apparatus 170, the carrier replacing apparatus 180, and the carrier cleaner 160 in the plant, complicating the carrier transfer and replacement work and thereby increasing the cost due to an increase in the number of work steps to be employed. Further, since the conveyance of the carriers is manually carried out, a human error occurs.

SUMMARY OF THE INVENTION

In view of the foregoing, the present invention has been made, and an object of the present invention is to automate carrier replacement and transfer, omit carrier transportation work, and reduce the frequency of carrier cleaning.

According to one aspect of the present invention, a substrate carrier management system includes a substrate processing apparatus, a carrier cleaner, a carrier conveyer, and a controller. The substrate processing apparatus takes a substrate out of a carrier in which the substrate is stored, and performs predetermined processing on the substrate, and transfers the processed substrate stored in a carrier. The carrier cleaner cleans the carrier. The carrier conveyer conveys the carrier between the substrate processing apparatus and the carrier cleaner. The controller controls the substrate processing apparatus, the carrier cleaner, and the carrier conveyer.

According to another aspect of the present invention, there is provided a program causing a computer to perform the following processes. A carrier storing a substrate is supplied to a substrate processing apparatus. The substrate processing apparatus causes to take the substrate out of the supplied carrier and to perform predetermined processing on the substrate. The carrier having been emptied as a result of taking the substrate out is supplied to a carrier cleaner. The cleaned carrier is returned to the substrate processing apparatus. After the predetermined processing has been completed, the substrate is stored in the cleaned carrier and is unloaded from the substrate processing apparatus.

According to the present invention, a carrier can be conveyed between a substrate processing apparatus and a carrier cleaner. Therefore, it is possible to automatically unload an empty carrier from the substrate processing apparatus and transfer it to the carrier cleaner prior to a step in which carrier contamination poses a problem, and automatically supply the substrate processing apparatus with an empty carrier to be used after processing. With this arrangement, it is possible to omit the manual carrier transportation work.

Other and further objects, features and advantages of the invention will appear more fully from the following description.

BRIEF DESCRIPTION OF THE DRAWINGS

FIG. 9 is a flowchart showing the operation for the processed products included in the operation of the diffusion processing module.

FIG. 10 shows the operation of the diffusion processing apparatus.

DETAILED DESCRIPTION OF THE PREFERRED EMBODIMENTS

First Embodiment

Figure 1:
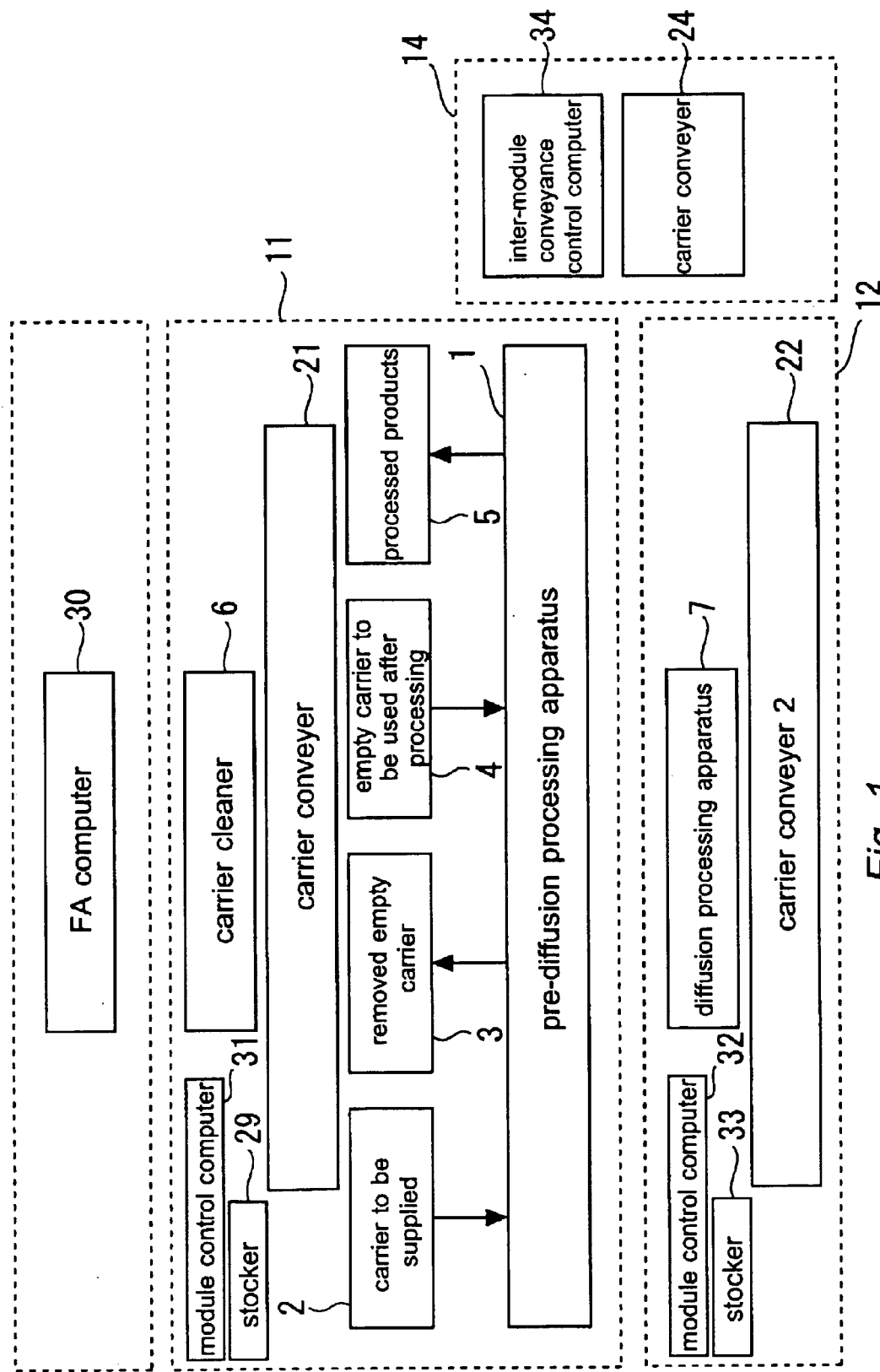
FIG. 1 is a block diagram showing the configuration of a carrier management system according to the first embodiment.

First, a first embodiment of the present invention will be described with reference to FIGS. 1 to 10. FIG. 1 is a block diagram showing the configuration of a carrier management system according to the first embodiment. In the figure, reference numeral 1 denotes a pre-diffusion processing apparatus; 2 a carrier to be supplied; 3 a removed empty carrier; 4 an empty carrier to be used after processing; 5 processed products; 6 a carrier cleaner; 7 a diffusion processing apparatus; and 21, 22, and 24 carrier conveyers.

Reference numeral 30 denotes an FA computer for controlling the entire system, and 11 and 12 denote modules that are each a collection of processing apparatuses. Specifically, reference numeral 11 denotes a pre-diffusion processing module that includes a pre-diffusion processing apparatus 10, while 12 denotes a diffusion processing module that includes a diffusion processing apparatus. Further, reference numerals 31 and 32 each denote a module control computer provided in the respective modules, while 29 and 33 each denote a stocker provided in the respective modules to store carriers.

Still further, reference numeral 14 denotes an inter-module conveyance system for performing control to convey products between the above modules. The inter-module conveyance system 14 includes an inter-module conveyance control computer 34 and the carrier conveyer 24.

Figure 2:
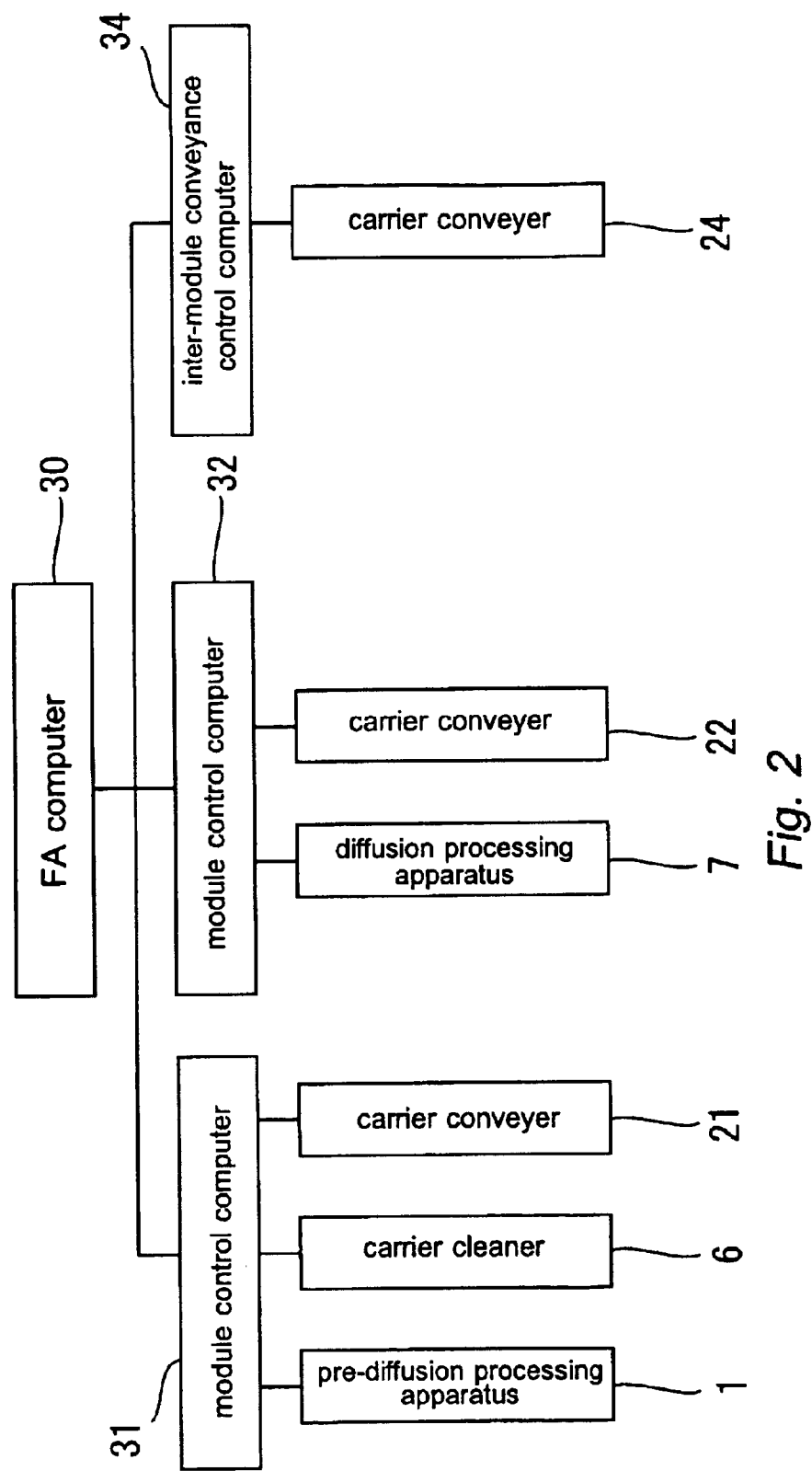
FIG. 2 is a block diagram showing a hierarchy of a substrate carrier management system of the present invention.

FIG. 2 is a block diagram showing a hierarchy of a substrate carrier management system of the present invention. As shown in the figure, the FA computer 30 sends an instruction for processing to be performed in the carrier management system to the module control computers 31 and 32 each in the respective modules and the inter-module conveyance control computer 34. In the pre-diffusion processing module 11, the instruction is relayed from the module control computer 31 to the pre-diffusion processing apparatus 1, the carrier cleaner 6, and the carrier conveyer 21. In the diffusion processing module 12, on the other hand, the instruction is relayed from the module control computer 32 to the diffusion processing apparatus 7 and the carrier conveyer 22. Furthermore, in the inter-module conveyance system 14, the instruction is relayed from the inter-module conveyance control computer 34 to the carrier conveyer 24.

As examples, description will be made below of such processing as pre-diffusion processing (cleaning), diffusion processing, and photolithography included in the semiconductor device fabrication step.

Figure 3:
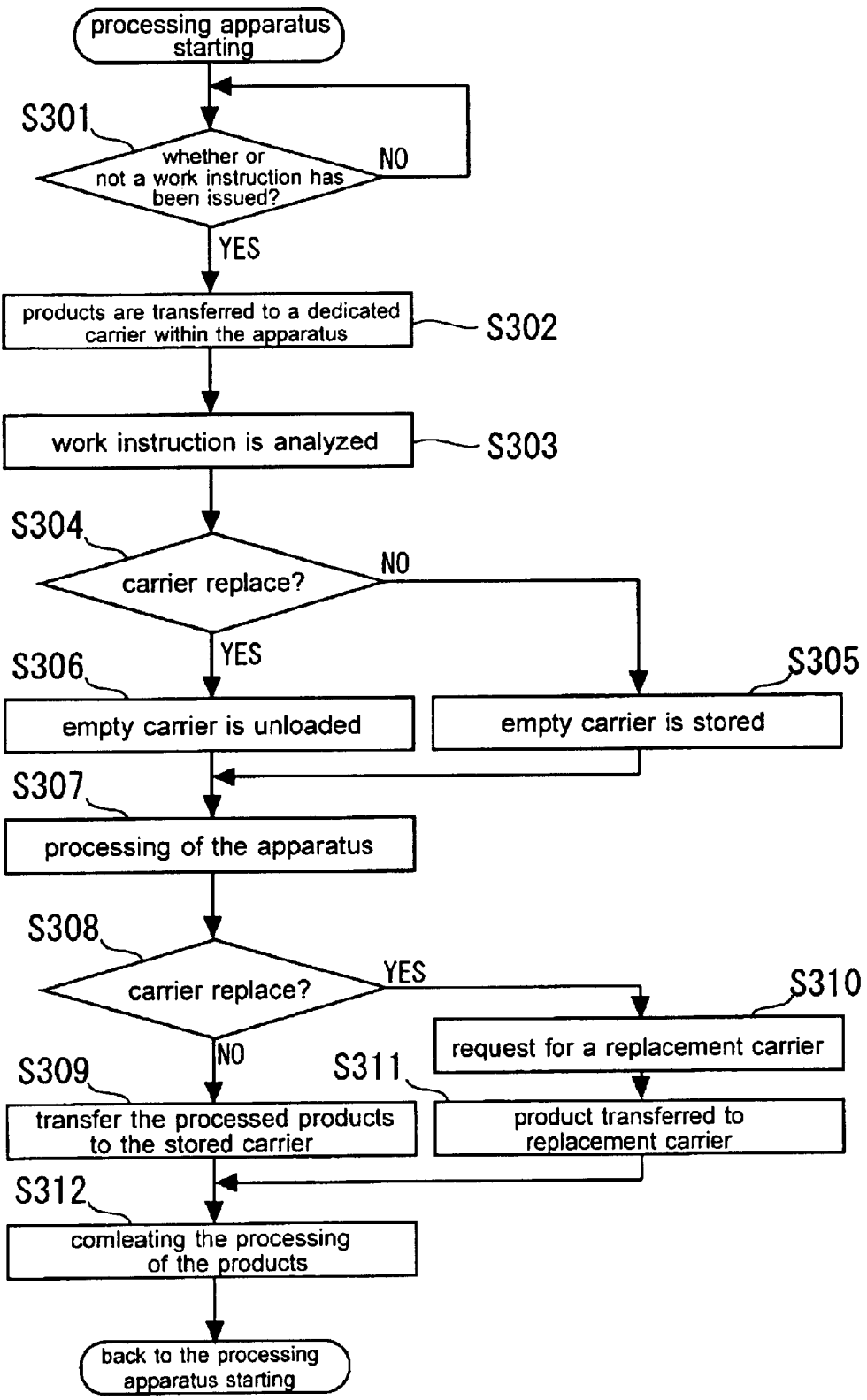
FIG. 3 shows the operation of the pre-diffusion processing apparatus.

FIGS. 3 to 10 are flowcharts showing control flows of the carrier management system according to the first embodiment. Description will be made of the processing procedure of the empty carrier management system with alternate reference to these flowcharts. FIG. 3 shows the operation of the pre-diffusion processing apparatus 1; FIGS. 4 to 8 show the operation of the pre-diffusion processing module 11; and FIGS. 9 and 10 show the operation of the diffusion processing module 12.

Figure 4:
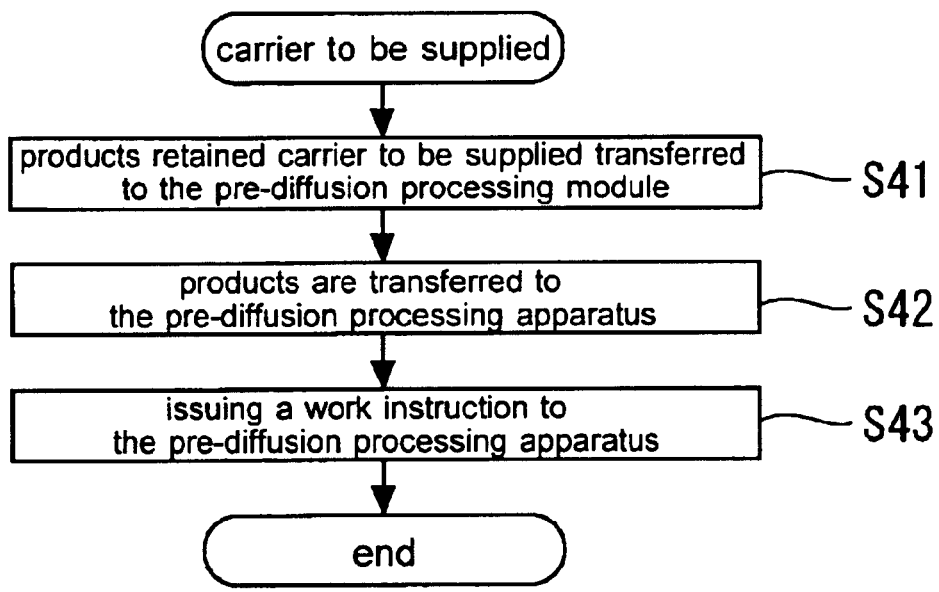
FIG. 4 is a flowchart showing the operation for the carrier to be supplied included in the operation of the pre-diffusion processing module.

FIG. 4 is a flowchart showing the operation for the carrier 2 to be supplied included in the operation of the pre-diffusion processing module 11. At Step S41, products retained in the carrier 2 (a general-type carrier) to be supplied are transferred to the pre-diffusion processing module 11 for pre-diffusion processing. In this control, the FA computer 30 determines the processing apparatus for a next step based on the progress of processing of the products and issues an execution instruction to the inter-module conveyance control computer 34, accordingly. The detailed description of the control is omitted.

The pre-diffusion processing module 11 includes the stocker 29 for temporarily storing products until the products are supplied to an apparatus within the module. The products retained in the transferred general-type carrier are temporarily stored in the stocker 29. The FA computer 30 issues an instruction to the module control computer 31 so that the carrier conveyer 21 performs the above processing.

At Step S42, at the request of the pre-diffusion processing apparatus 1 which is to perform the next processing step, the products are transferred from the stocker 29 to the pre-diffusion processing apparatus 1. The FA computer 30 issues an instruction to the module control computer 31 so that the carrier conveyer 21 performs the above processing.

At the next Step S43, upon receiving a notification of completion of the work at Step S42 from the module control computer 31, the FA computer 30 issues a work instruction to the pre-diffusion processing apparatus 1, completing the operation for the carrier to be supplied shown in FIG. 4. This work instruction includes information such as the name of a product, control conditions for the product, and the types of carriers to be used before and after processing.

Upon receiving the products, the pre-diffusion processing apparatus 1 starts an operation based on a work instruction as shown in the flowchart of FIG. 3. At Step S301, it is determined whether or not a work instruction has been issued, and if it has been issued, the processing flow proceeds to Step S302. If it has not been issued, on the other hand, the pre-diffusion processing apparatus 1 assumes a wait state at Step S301. At Step S302, the products in the supplied carrier are transferred to a dedicated carrier within the apparatus. The carrier emptied of the products is designated as an empty carrier. The content of the work instruction is analyzed at Step S303. At the next Step S304, the type of carrier to be used before the processing is compared with that after the processing. If they are the same, it is determined that no carrier replacement is required, and the empty carrier is stored within the apparatus at Step S305. If the type of carrier to be used before the processing is different from that after the processing, on the other hand, it is determined that carrier replacement is required, and a request for unloading the empty carrier is sent to the FA computer 30 in order to unload the empty carrier at Step S306.

Figure 5:
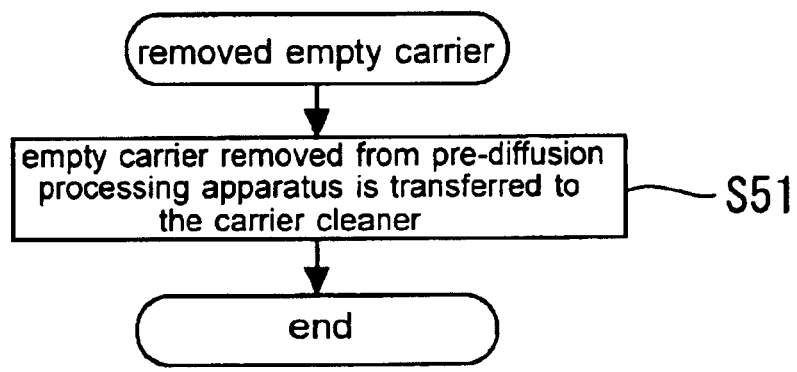
FIG. 5 is a flowchart showing the operation for the removed empty carrier included in the operation of the pre-diffusion processing module.

FIG. 5 is a flowchart showing the operation for the removed empty carrier 3 included in the operation of the pre-diffusion processing module 11. At Step S51 in the figure, the FA computer 30 sends to the module control computer 31 an instruction to transfer the empty carrier 3 unloaded from the pre-diffusion processing apparatus 1 to the carrier cleaner 6. The module control computer 31 executes this instruction by use of the carrier conveyer 21. This completes the operation for the removed empty carrier 3.

Referring back to FIG. 3, upon completing the processing (pre-diffusion processing) of the products at Step S307, the pre-diffusion processing apparatus 1 determines at Step S308 whether or not it is necessary to replace the carrier. If it is not necessary to replace the carrier, the processing flow proceeds to Step S309 to transfer the processed products to the carrier stored at Step 305. If it is necessary to replace the carrier, on the other hand, the pre-diffusion processing apparatus 1 sends a request for a replacement carrier to the FA computer 30 at Step S310. At this request, the carrier 4 to be used after processing is transferred to the pre-diffusion processing apparatus 1 as shown at Step S61 in FIG. 6.

Figure 6:
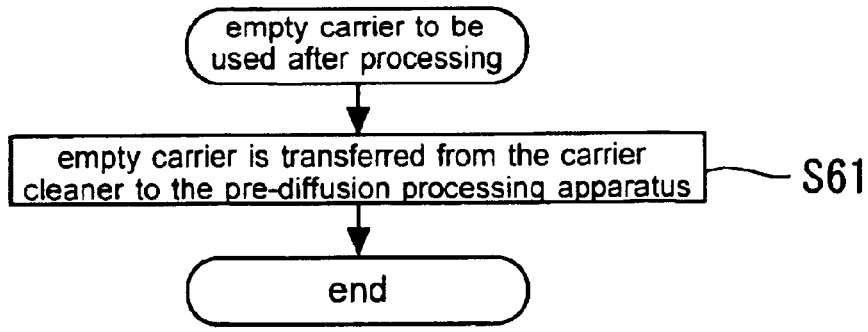
FIG. 6 is a flowchart showing the operation for the empty carrier to be used after processing included in the operation of the pre-diffusion processing module.

FIG. 6 is a flowchart showing the operation for the empty carrier 4 to be used after processing included in the operation of the pre-diffusion processing module 11. As shown in the figure, the FA computer 30 sends to the module control computer 31 an instruction to transfer the empty carrier 4 (to be used after processing) from the carrier cleaner 6 to the pre-diffusion processing apparatus 1 (Step S61). The module control computer 31 executes this instruction by use of the carrier conveyer 21.

Upon receiving a notification of completion of the work at Step S61 from the module control computer 31, the FA computer 30 issues to the pre-diffusion processing apparatus 1 an instruction for completion of supply of the empty carrier 4 to be used after processing.

Referring back to FIG. 3, at Step S311, the pre-diffusion processing apparatus 1 transfers the products to the supplied empty carrier 4 to be used after processing as is the case with Step S309 which is performed when it has been determined that no carrier replacement is required. That is, whether or not the carrier has been replaced, the pre-diffusion processing apparatus 1 transfers the products to the stored carrier or the empty carrier to be used after processing, and issues a notification of completion of processing of the products to the FA computer 30 at Step S312.

Figure 7:
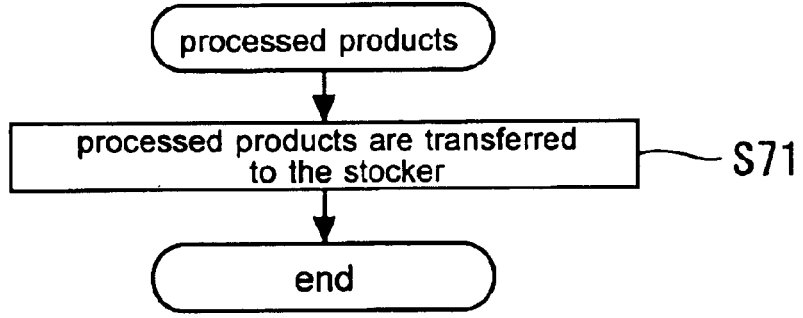
FIG. 7 is a flowchart showing the operation for the processed products included in the operation of the pre-diffusion processing module.

FIG. 7 is a flowchart showing the operation for the processed products 5 included in the operation of the pre-diffusion processing module 11. As shown in the figure, at Step S71, the FA computer 30 issues to the module control computer 31 an instruction to transfer the processed products 5 to the stocker 29 in the pre-diffusion processing module 11. The module control computer 31 executes this instruction by use of the carrier conveyer 21.

Figure 8:
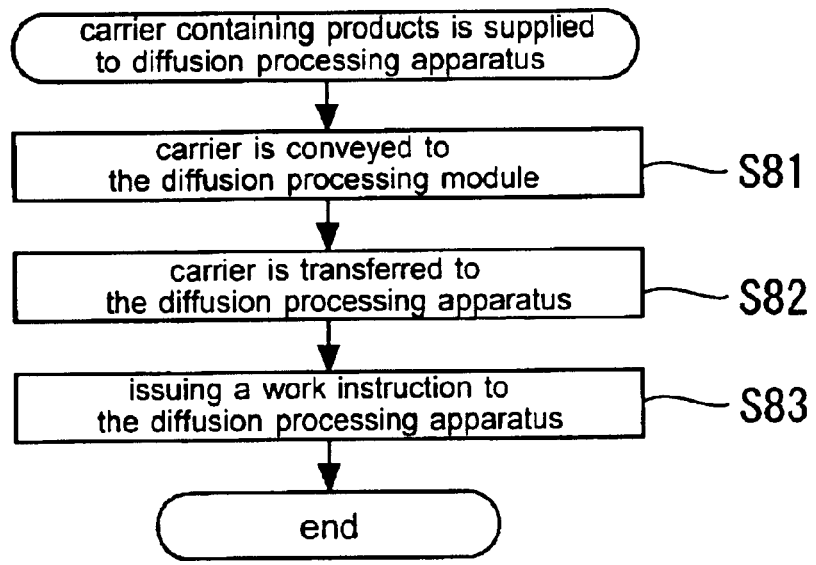
FIG. 8 is a flowchart showing an operation in which a carrier containing products is supplied to the diffusion processing apparatus.

FIG. 8 is a flowchart showing an operation in which a carrier containing products is supplied to the diffusion processing apparatus 7 and which is included in the operation of the diffusion processing module 12. Upon receiving a notification of completion of the work at Step S71 from the module control computer 31, the FA computer 30 conveys the carrier containing the products to the diffusion processing module 12 (for the next process) by use of the inter-module conveyance system 14 for diffusion processing. In this processing, the FA computer 30 determines the processing apparatus for a next process based on the progress of processing of the products. The detailed description of the processing will be omitted. The diffusion processing module 12 includes the stocker 33 for temporarily storing products until the products are supplied to an apparatus within the module. The transferred carrier containing the products is temporarily stored in the stocker 33. The FA computer 30 instructs the module control computer 32 in the diffusion processing module 12 to perform this processing.

At Step S82, based on a request from the diffusion processing apparatus 7, the FA computer 30 sends to the module control computer 32 an instruction to transfer the carrier containing the products from the stocker 33 to the diffusion processing apparatus 7 in the diffusion processing module 12. This instruction is executed by use of the carrier conveyer 22.

Upon receiving a notification of completion of Step S82 from the module control computer 32, the FA computer 30 issues a work instruction to the diffusion processing apparatus 7 at Step S83. This work instruction includes the name of a product, control conditions for the product.

The diffusion processing apparatus 7 performs processing according to the flowchart shown in FIG. 10. At Step S101, it is determined whether or not a work instruction has been issued by the FA computer 30, and if it has been issued, the processing flow proceeds to Step S102. If it has not been issued, on the other hand, the diffusion processing apparatus 7 assumes a wait state at Step S101. At Step S102, the work instruction from the FA computer 30 is analyzed. The diffusion processing apparatus 7 processes the products based on the work instruction at Step S103, and completes the processing of the products at Step S104.

Upon completion of the processing at Step S104, the FA computer 30 sends to the module control computer 32 an instruction to transfer the carrier containing the products from the diffusion processing apparatus 7 to the stocker 33 in the diffusion module 12 as shown at Step S91 in FIG. 9. The module control computer 32 executes this instruction by use of the carrier conveyer 22.

Upon receiving a notification of completion of the work from the module control computer 32, the FA computer 30 conveys the carrier containing the products to the module for the next step by use of the inter-module conveyance system 14 for the next processing. In this processing, the FA computer 30 determines the processing apparatus for a next process based on the progress of processing of the products. The detailed description of the processing will be omitted.

As described above, the first embodiment can automate both the unloading of the empty carrier 3 from the pre-diffusion processing apparatus 1 and the supply of the empty carrier 4 to be used after processing to the pre-diffusion processing apparatus 1 before the diffusion processing step in which carrier contamination poses a problem. Furthermore, the empty carrier 3 can be cleaned during the pre-diffusion processing step and used as the carrier 4 to be used after processing, making it possible to automatically replace a carrier with a cleaned carrier in a process prior to the diffusion processing step which requires carrier replacement. With this arrangement, it is possible to omit the manual carrier transportation work as well as reducing the frequency of carrier cleaning.

Figure 11:
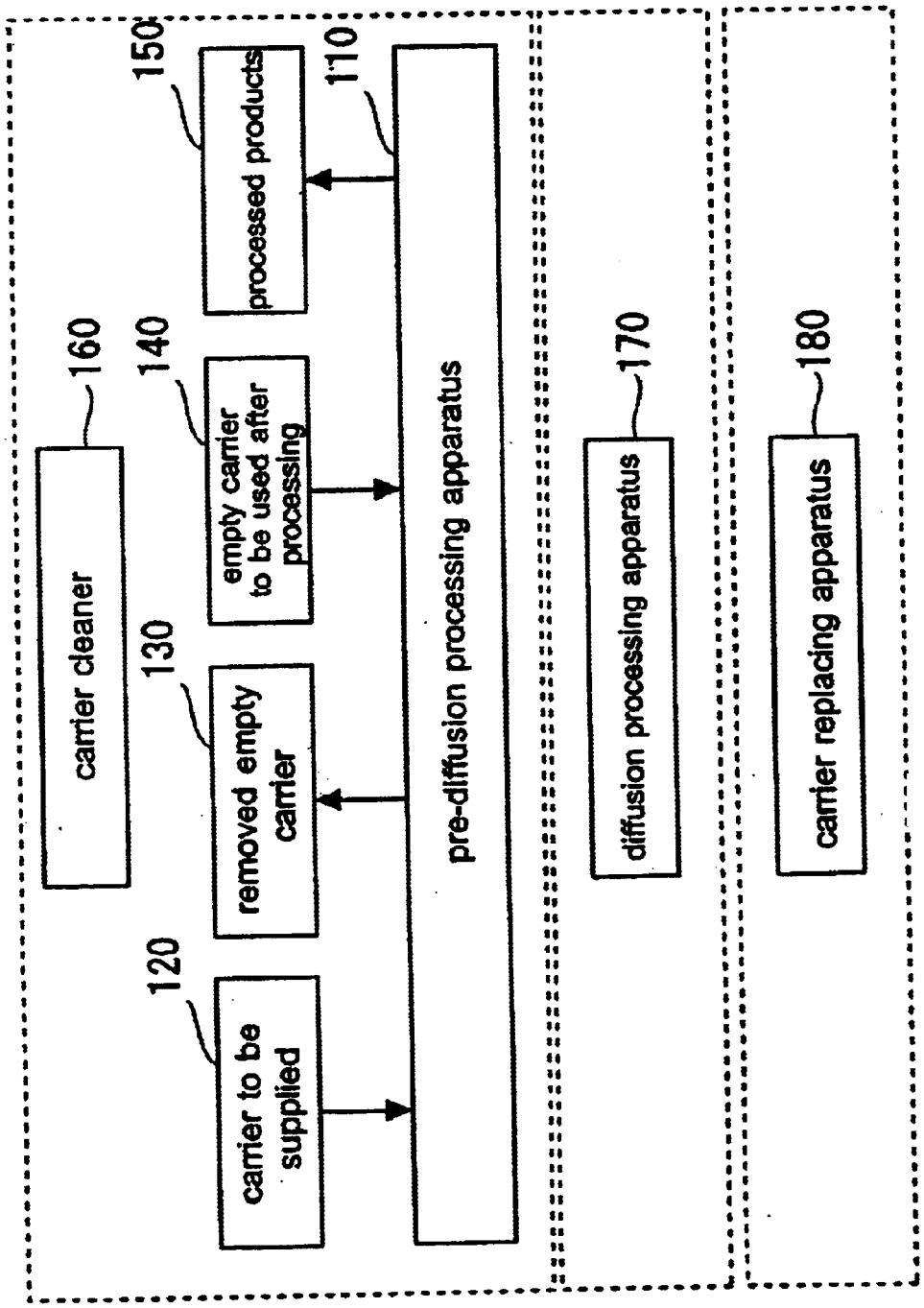
FIG. 11 is a block diagram showing the configuration of a carrier management system according to the related art.

Furthermore, in the conventional diffusion processing process, in the case where a carrier is replaced with a dedicated carrier before diffusion processing, carrier replacement is further required to switch to a general-type carrier after completion of processing performed by the diffusion processing apparatus 7, necessitating additional carrier replacement work by use of a carrier replacing apparatus, as described with reference to FIG. 11. According to the first embodiment, however, a carrier can be automatically cleaned before the diffusion step to continuously use a cleaned general-type carrier without switching to a dedicated carrier in the subsequent step. Accordingly, a general-type carrier can be used after the diffusion step without changing carriers, making it possible to eliminate the need for carrying out additional work.

Thus, it is only necessary to supply a cleaned general-type carrier to the pre-diffusion processing apparatus 1 after Step S51 of FIG. 5 to change carriers, eliminating the need for conveying a carrier to a special apparatus such as a carrier replacing apparatus for carrier replacement. With this arrangement, it is possible to simplify the system configuration. Furthermore, since use of a carrier dedicated for diffusion is not required, it is not necessary to convey the carrier dedicated for diffusion to the carrier cleaner 6 in the pre-diffusion processing module 11 for cleaning after diffusion processing.

Further, since the empty carrier 3 unloaded from the pre-diffusion processing apparatus 1 is automatically cleaned and used as the empty carrier 4 to be used after processing, cleaning of only general-type carriers is performed in the cleaning process, halving the frequency of the cleaning, as compared with the case in which the carrier replacement is carried out.

Second Embodiment

A second embodiment of the present invention will be described below. In the second embodiment, in the case where an ID (identification symbol) is attached to each carrier for its identification, the FA computer 30 can determine the need for the cleaning based on the history of the empty carrier 3 obtained by referring to its ID when the empty carrier 3 is cleaned by the carrier cleaner 6.

If the FA computer 30 determines that carrier cleaning is not required, in the step of carrier cleaning the empty carrier 3 is not conveyed to the carrier cleaner 6, but it is conveyed to the stocker 29 in the module. Then, when the pre-diffusion processing apparatus 1 has requested the empty carrier 3, the empty carrier is supplied from the stocker 29 to the pre-diffusion processing apparatus 1.

Thus, the second embodiment adds an ID to each carrier for its identification, which makes it possible to perform cleaning after determining whether or not it is required based on the ID. With this arrangement, it is possible to configure a carrier management system in which unnecessary carrier cleaning is eliminated to ensure execution of required cleaning.

Third Embodiment

A third embodiment of the present invention will be described below. In the first and second embodiments, the processing step for the products that require carrier replacement is described as the diffusion processing step performed by the diffusion processing apparatus 7. In addition, the automatic changing carrier in the pre-diffusion processing apparatus is described; however, a step other than the diffusion processing step may require carrier replacement.

The third embodiment assumes that carrier replacement is required for another step in which carrier contamination poses a problem, such as a metalization step. Processing similar to that for the pre-diffusion processing step employed by the first and second embodiments can be performed during the step prior to each step which requires carrier replacement, with the same effect as that of the first and second embodiments described above.

Thus, according to the third embodiment, it is possible to configure a carrier management system in which the same processing as that of the first embodiment can be performed whatever step requires carrier replacement.

The processing performed by the above embodiments can be performed in a configuration which includes hardware such as the FA computer 30, the module control computers 31 and 32, and the inter-module conveyance control computer 34 as described above. On the other hand, the above processing may be realized in a configuration in which the functional blocks are realized by a microcomputer system comprising a CPU or an MPU, a ROM(s), a RAM(s), etc. (not shown) included in the FA computer 30, and the microcomputer system is operated according to work programs stored in the ROM and the RAM. Furthermore, the work programs may be provided separately from the FA computer 30, and equipment storing the programs may be attached to an attachment provided on the FA computer 30.

The present invention also includes an arrangement in which software programs for realizing the functions of the above functional blocks are supplied to the RAM of the FA computer 30, and each functional block is operated according to the programs. In this case, since the above software programs themselves realize the functions of each embodiment, the present invention includes the programs themselves and means for supplying the programs to a computer, for example, a storage medium storing the programs.

Configured as described above, the present invention has the following effects.

A carrier can be conveyed between a substrate processing apparatus and a carrier cleaner. Therefore, it is possible to automatically unload an empty carrier from the substrate processing apparatus and transfer it to the carrier cleaner prior to a step in which carrier contamination poses a problem, and automatically supply the substrate processing apparatus with an empty carrier to be used after processing. With this arrangement, it is possible to omit the manual carrier transportation work.

An empty carrier unloaded from a substrate processing apparatus is cleaned by a carrier cleaner, and processed substrates are retained in the cleaned carrier to transfer the substrates. Therefore, it is possible to continuously use the cleaned carrier in the subsequent step without switching to a dedicated carrier, reducing the frequency of carrier cleaning.

A carrier cleaner cleans an empty carrier while a substrate processing apparatus is carrying out predetermined processing. Therefore, it is possible to efficiently perform carrier cleaning and replacement.

Whether a carrier need be cleaned by a carrier cleaner is determined based on an identification symbol of the carrier. Therefore, it is possible to configure a carrier management system in which unnecessary carrier cleaning is prevented to ensure execution of necessary cleaning.

A carrier unloaded from a substrate processing apparatus is transferred to the next step beforehand which requires carrier replacement. Therefore, it is possible to use a cleaned carrier without changing carriers prior to the next step.

Furthermore, by using the substrate carrier management system described above, manual carrier transportation work can be omitted when fabricating a semiconductor device. In addition, it is possible to reduce the frequency of cleaning of carriers, thereby reducing the production cost of the semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-257665, filed on Aug. 28, 2001 including specification, claims, drawings and summary, on which the Convention priority of the present application is based, are incorporated herein by reference in its entirety.

What is claimed is:

1. A substrate carrier management system comprising:
   a substrate processing apparatus for taking a substrate out of a carrier in which said substrate is stored, performing predetermined processing on said substrate, and transferring said processed substrate stored in a carrier;
   a carrier cleaner for cleaning said carrier;
   a carrier conveyer for conveying said carrier between said substrate processing apparatus and said carrier cleaner; and
   a controller for controlling said substrate processing apparatus, said carrier cleaner, and said carrier conveyer in such a way that said carrier cleaner cleans said carrier emptied and unloaded from said substrate processing apparatus, and said substrate processing apparatus transfers said substrate stored in said carrier cleaned by said carrier cleaner after said substrate is processed.

2. The substrate carrier management system according to claim 1 wherein said controller controls said carrier cleaner to clean said empty carrier while said substrate processing apparatus is performing predetermined processing.

3. The substrate carrier management system according to claim 1 wherein said controller controls said carrier conveyer to transfer said carrier unloaded from said substrate processing apparatus to a next process in which said carrier is replaced with another carrier before a predetermined process is performed.

4. A substrate carrier management system comprising:
   a substrate processing apparatus for taking a substrate out of a carrier in which said substrate is stored, performing predetermined processing on said substrate, and transferring said processed substrate stored in a carrier;
   a carrier cleaner for cleaning said carrier;
   a carrier conveyer for conveying said carrier between said substrate processing apparatus and said carrier cleaner; and
   a controller for controlling said substrate processing apparatus, said carrier cleaner, and said carrier conveyer, wherein
   said carrier has an identification symbol, and said controller determines, based on said identification symbol, whether or not it is necessary to clean said carrier in said carrier cleaner.

5. A computer readable medium bearing a program for a computer in a substrate carrier management system, the program, when executed, causing the computer to control the substrate management system to perform the steps of:
   supplying a carrier to a substrate processing apparatus, said carrier storing a substrate;
   causing said substrate processing apparatus to take said substrate out of said supplied carrier and perform predetermined processing on said substrate;
   supplying said carrier to a carrier cleaner to clean said carrier, said carrier having been emptied as a result of taking said substrate out of said carrier;
   returning said cleaned carrier to said substrate processing apparatus; and
   unloading said substrate stored in said cleaned carrier from said substrate processing apparatus after said predetermined processing on said substrate has been completed.

6. The computer readable medium according to claim 5, further comprising the step of:
   causing said carrier cleaner to clean said carrier while said substrate processing apparatus is performing said predetermined processing.

7. The computer readable medium according to claim 5, further comprising the step of:
   determining, based on an identification symbol attached to said carrier, whether or not it is necessary to clean said carrier in said carrier cleaner.

8. The computer readable medium according to claim 5, further comprising the step of:
   transferring said carrier unloaded from said substrate processing apparatus to a next process in which said carrier is replaced with another carrier before a predetermined process is performed.

* * * * *